(12) United States Patent
Antonakopoulos et al.

(10) Patent No.: US 9,672,910 B2
(45) Date of Patent: Jun. 6, 2017

(54) MEMORY ARCHITECTURE FOR STORING DATA IN A PLURALITY OF MEMORY CHIPS

(71) Applicant: INTERNATIONAL BUSINESS MACHINES CORPORATION, Armonk, NY (US)

(72) Inventors: Theodore Antonakopoulos, Patras (GR); Nikolaos Papandreou, Thalwil (CH); Charalampos Pozidis, Thalwil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 258 days.

(21) Appl. No.: 14/248,377

(22) Filed: Apr. 9, 2014

(65) Prior Publication Data

US 2014/0325124 A1    Oct. 30, 2014

(30) Foreign Application Priority Data

Apr. 30, 2013 (EP) .................................. 13166082

(51) Int. Cl.
| | |
|---|---|
| G06F 12/00 | (2006.01) |
| G11C 14/00 | (2006.01) |
| G11C 7/10 | (2006.01) |
| G11C 11/56 | (2006.01) |
| G11C 13/00 | (2006.01) |
| G11C 5/06 | (2006.01) |

(52) U.S. Cl.
CPC .......... *G11C 14/009* (2013.01); *G11C 7/1003* (2013.01); *G11C 7/1006* (2013.01); *G11C 11/5678* (2013.01); *G11C 5/066* (2013.01); *G11C 7/10* (2013.01); *G11C 13/0004* (2013.01)

(58) Field of Classification Search
CPC ... G11C 14/009; G11C 7/1003; G11C 7/1006; G11C 11/5678; G11C 5/066; G11C 7/10; G11C 13/0004; G06F 3/0679; G06F 3/0688
See application file for complete search history.

(56) References Cited

U.S. PATENT DOCUMENTS

| | | | |
|---|---|---|---|
| 8,219,886 B1 | 7/2012 | Sutardja et al. | |
| 8,244,961 B2 | 8/2012 | Luo et al. | |
| 2008/0016269 A1 | 1/2008 | Chow et al. | |
| 2009/0300274 A1* | 12/2009 | Luo ...................... | G06F 3/0611 |
| | | | 711/103 |

(Continued)

OTHER PUBLICATIONS

Chien et al., "A Multi-Level 40nm WOx Resistive Memory with Excellent Reliability," Electron Devices Meeting (IEDM), 2011 IEEE Intern'l, Dec. 5-7, 2011, p. 31.5.1-31.5.4.

(Continued)

*Primary Examiner* — John A Lane
(74) *Attorney, Agent, or Firm* — Keivan E Razavi (57) ABSTRACT

A memory system for storing data in a plurality N of memory chips. The memory system includes a number K of sets of memory chips, wherein each set of the K sets includes a number M of the memory chips, with N=K·M; and one signal processing unit having a number L of signal processing engines for signal processing data of the N memory chips and having a data link interface for interfacing each of the K sets.

7 Claims, 7 Drawing Sheets

(56) References Cited

U.S. PATENT DOCUMENTS

| | | | |
|---|---|---|---|
| 2013/0227380 A1 | 8/2013 | Mittelholzer et al. | |
| 2013/0294157 A1* | 11/2013 | Sharon .............. | G06F 11/1072 365/185.03 |
| 2014/0149828 A1* | 5/2014 | Chang ............... | G06F 11/1012 714/773 |
| 2015/0169402 A1* | 6/2015 | Wu ..................... | G11C 29/52 714/764 |
| 2016/0005460 A1* | 1/2016 | Weathers .......... | G11C 16/3454 365/185.03 |

OTHER PUBLICATIONS

Dong et al., "On the Use of Soft-Decision Error-Correction Codes in NAND Flash Memory," IEEE Transactions on Circuits and Systems-I: Regular Papers, vol. 58, No. 2, Feb. 2, 2011.

Ielmini et al., "Resistance-Dependent Amplitude of Random Telegraph-Signal Noise in Resistive Switching Memories," Applied Physics Letters 96, 053503, 2010.

Papandreou et al., "Drift-Tolerant Multilevel Phase-Change Memory," Memory Workshop (IMW), 2011 3rd IEEE International, May 22-25, 2011, p. 1-4.

Ricco et al., "Nonvolatile Multilevel Memories for Digital Applications," Proceedings of the IEEE, vol. 86, No. 12, Dec. 1998, p. 2399-2421.

Wong et al., "Phase Change Memory," Proceedings of the IEEE, vol. 98, No. 12, Dec. 2010, p. 2201-2227.

\* cited by examiner

MEMORY ARCHITECTURE FOR STORING DATA IN A PLURALITY OF MEMORY CHIPS

CROSS-REFERENCE TO RELATED APPLICATION

This application claims priority under 35 U.S.C. §119 from EP Patent Application No. 13166082.1 filed Apr. 30, 2013, the entire contents of which are incorporated herein by reference.

BACKGROUND OF THE INVENTION

1. Field of the Invention

The present invention relates to a memory system and a method for operating the memory system. More particularly, the present invention is related to a memory system including multi-level cell (MLC) memory having a plurality of programmable levels.

2. Description of the Related Art

A prominent example for MLC memory cells having a plurality of programmable levels is Resistive Random Access Memory, particular Phase Change Memory, or Flash. PCM is a non-volatile solid-state memory technology that exploits a reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM can be considered a prime candidate for Flash replacement, embedded/hybrid memory and storage-class memory. Key requirements for competitiveness of PCM technology can be multi-level cell functionality, in particular for low cost per bit, and high-speed read/write operations, in particular for high bandwidth. Multilevel functionality, i.e. multiple bits per PCM cell, can be a way to increase storage capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, can be enabled by Joule heating. In this regard, Joule heating can be controlled by a programming current or voltage pulse. Storing multiple resistance levels in a PCM cell is a challenging task.

In MLC PCM, the physical quantity measured during cell readout, i.e., the electrical resistance drifts upwards with time following a deterministic empirical power-law with stochastic fluctuations. In MLC Flash, the physical quantity measured is the transistor's threshold voltage, which in turn drifts upwards as a function of the number of program/erase cycles. Moreover, in solid-state memory technologies, the read signal is hampered by noise having RTN signature and 1/f characteristics. In order to increase the reliability of such devices, it can be necessary to use advanced signal processing and/or coding methods that allow the estimation and detection of the stored information levels. These types of signal processing functions use as input the soft-information from the readout signal and typically operate on a data-block basis, i.e., on a group of read-out values. The requirement for using advanced signal processing in the read process can introduce latency and data overhead which have to be kept at minimum levels for solid-state memory applications. In this context, careful design of the memory system architecture can be a key factor to achieve maximum performance with minimum circuit complexity.

A typical memory system includes of multiple memory chips which communicate with the main memory controller via a standard memory interface (MIF), e.g., LPDDR, ONFI etc. The memory controller is responsible for the memory data management and also provides the interface with the host processor (HIF). In the memory system, MLC memory chips and a CODEC can be used, wherein the CODEC is the unit that implements signal processing and coding functions based on soft-information from the read signal that is provided by the on-chip read circuitry. The goal of the CODEC unit is to provide an estimation of the stored multi-level symbols. These symbols are then translated to binary data symbols based on the applied encoding process. Typically, the estimation and detection algorithms operate in a block basis, which means that a number of cells need to be read in order for the algorithms to provide the output results.

Figure 1:
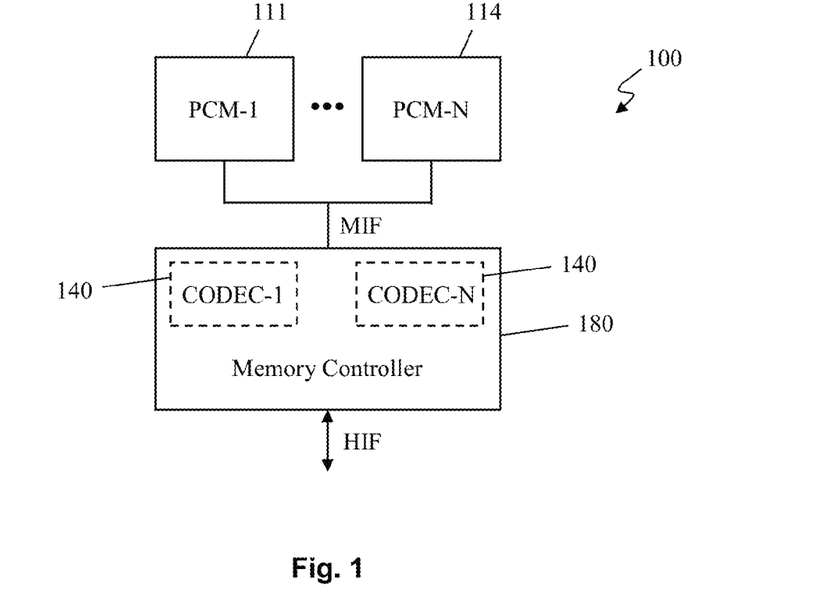
FIG. 1 shows a first example of a conventional memory system.
Figure 2:
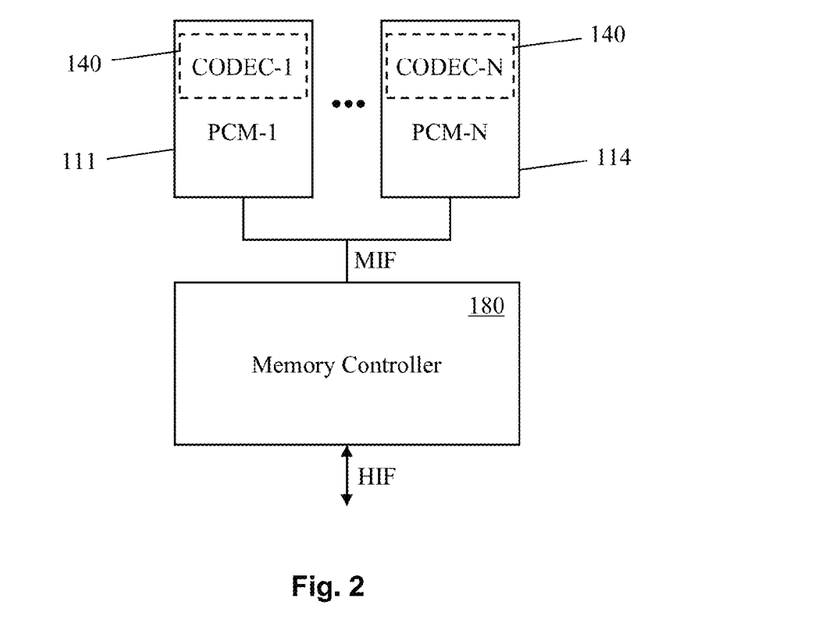
FIG. 2 shows a second example of a conventional memory system.
Figure 3:
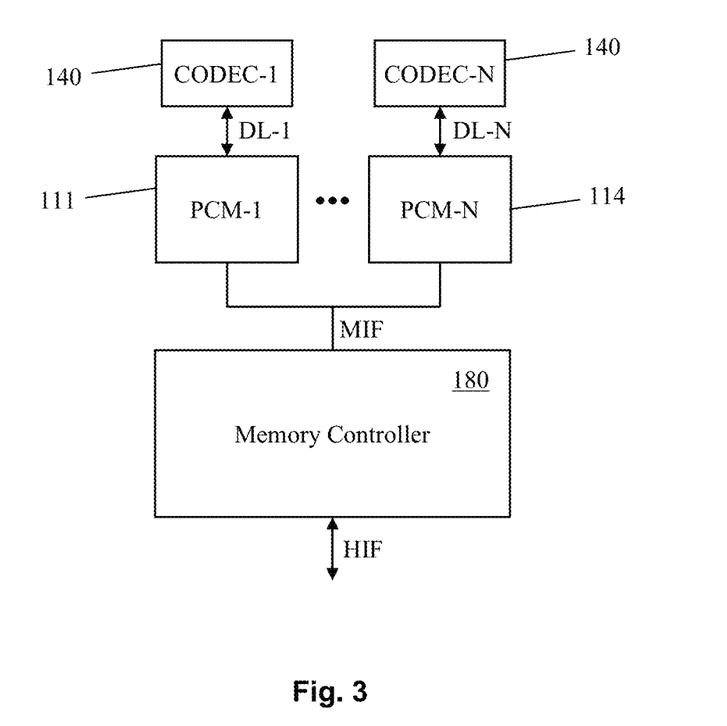
FIG. 3 shows a third example of a conventional memory system.

FIGS. 1-3 show different approaches for architecture of a memory system including N memory chips 111-114, here MLC PCM, and a memory controller 180. In FIG. 1, CODEC units 140 are integrated in memory controller 180. Depending on the data management, i.e., the allocation of data to different memory chips 111-114, the total number of CODEC units 140 can be less than N allowing for more efficient CODEC utilization. However, the approach of FIG. 1 is very tied to the specific CODEC functions, which in turn depends on the memory technology and the memory system application. In addition, since CODEC units 140 operate on soft-information from the read signal, the pin and data rate requirements between memory chips 111-114 and memory controller 180 can be affected significantly.

In FIGS. 2 and 3, CODEC units 140 are decoupled from main controller 180. In FIG. 2, the respective CODEC unit 140 is integrated in memory chip 111-114. In this approach, the overall cost and the size of memory chip 111-114 increases. In FIG. 3, the respective CODEC unit 140 is implemented as a stand-alone device and a dedicated data-link (DL) is used between memory chip 111-114 and CODEC unit 140. In the approach of FIG. 3, the memory chip size remains practically the same, but in expense additional pins and circuitry are required for data links DL1-DLN. In both approaches of FIGS. 2 and 3, a dedicated CODEC unit 140 is used for each memory chip 111-114, which imposes certain restrictions on the data allocation management in memory controller 180. Such restrictions can result in reduced data rates and low utilization of CODEC units 140. Moreover, in the case of a memory chip failure, e.g., at the end of the memory lifetime, not only memory chip 111-114 but also the dedicated CODEC unit 140 are no longer operational from a system aspect.

U.S. Pat. No. 8,219,886 B1 describes a high density multi-level memory. The memory apparatus includes a memory block including a plurality of cells, each cell adapted to operate with multi-level signal. Such a memory apparatus also includes a channel block adapted to code data values in accordance with a coding scheme that favorably effects a distribution of the multi-levels of the multi-level signals, and to output the corresponding multi-level signals of the coded data values to the memory block.

US Patent Pub. No. 2008/0016269 A1 shows a flash/phase-change memory in multi-ring topology using serial-link packet interface. A multi-ring memory controller sends request packets to multiple rings of serial flash-memory chips. Each of the multiple rings has serial flash-memory chips with serial links in a uni-directional ring. Each serial flash-memory chip has a bypassing transceiver with a device ID checker that bypasses serial packets to a clock resynchronizer and bypass logic for retransmission to the next device in the ring, or extracts the serial packet to the local device when an ID match occurs. Serial packets pass through all devices in the ring during one round-trip transaction from the controller. The average latency of one round is constant for all devices on the ring, reducing data-dependent performance, since the same packet latency occurs regardless of the data location on the ring. The serial links can be a Peripheral Component Interconnect (PCI) Express bus. Packets have modified-PCI-Express headers that define the packet type and data-payload length.

U.S. Pat. No. 8,244,961 B2 describes a SSD system with distributed processors. The system includes a serial data bus, a plurality of processors of a first type, and a processor of a second type. The serial data bus is configured to be coupled to a corresponding serial data bus of a host device. Each of the plurality of processors of the first type is coupled to a respective flash memory device. The processor of the second type is configured to manage the access that the plurality of the processors of the first type have to the serial data bus.

Accordingly, it is an aspect of the present invention to provide an improved memory system.

SUMMARY OF THE INVENTION

According to a first aspect of the present invention, a memory system for storing data in a plurality N of memory chips is provided. The memory system includes: a number K of sets of memory chips, wherein each set of the K sets includes a number M of the memory chips, with N=K·M; and one signal processing unit having a number L of signal processing engines for signal processing data of the N memory chips and having a data link interface for interfacing each of the K sets.

According to a second aspect of the present invention, a method for operating a memory system for storing data in a plurality N of memory chips is provided. The method includes: grouping the N memory chips into a number K of sets of memory chips, with N=K·M; and interfacing each of the K sets with the signal processing unit by means of a data link interface.

BRIEF DESCRIPTION OF THE DRAWINGS

Similar or functionally similar elements in the figures have been allocated the same reference signs if not otherwise indicated.

DETAILED DESCRIPTION OF THE PREFERRED EMBODIMENTS

The memory system, according to an embodiment of the present invention, includes N memory chips which are organized in K sets with M memory chips per set, and one signal processing unit with L hardware engines. An optimum configuration in terms of hardware complexity and data rate can depend on the system and application specifications, such as chip read latency, type of used signal processing unit, processing time and data rate of the data link interface. The present architecture can support the two corner configurations, namely that each memory chip is directly attached to the data link interface and that all memory chips form a single set and the data link interface has a single data link transceiver. The present memory system can provide the following advantages: expandability, flexibility, optimum data allocation and minimum circuit complexity. Regarding expandability, the architecture of the present memory system can be adapted to different numbers of memory chips and can support different memory specifications and data rates. Regarding flexibility, the architecture of the present memory system can be independent of the functionality of the signal processing unit, i.e. the signal processing unit can support different signal processing and soft-decoding functions based on the used memory technology and the application. Regarding optimum data allocation, the architecture of the present memory system can enable the allocation of data among the different memory chips of the memory system so as to achieve a maximum utilization of the signal processing unit and the maximum data rates. Regarding minimum circuit complexity, the present memory system can allow ring network architecture between the memory chips and the signal processing unit. The ring network architecture can further keep the number of data link transceivers at a minimum, and thus, reduce the circuit overhead and power dissipation.

According to an embodiment of the present invention N is an integer greater than or equal to 2 (N≥2). K is an integer greater than or equal to 1 (K≥1). L is an integer greater than or equal to 1 (L≥1). M is an integer greater than or equal to 1 and smaller than or equal to N (1≤M≤N).

In an embodiment, the data link interface includes K interface transceivers, where a respective one of the K interface transceivers is allocated to a respective one of the K sets. The respective interface transceiver is adapted to provide the data transmissions for the allocated set, in particular, for the memory chips of the allocated set.

In a further embodiment, each memory chip of the N memory chips has a single data link chip transceiver.

In a further embodiment, each of the N data link chip transceivers is configured to send data to one of the N-1 other data link chip transceivers or to one of the K interface transceivers, to receive data from one of the N-1 other data link chip transceivers or from one of the K interface transceivers, and to pass through received data to one of the N-1 other data link chip transceivers or to one of the K interface transceivers.

Advantageously, each memory chip can operate either as a source/sink of data or as a pass-through device. Therefore, ring architectures for data transmissions can be formed. In particular, in pass-through mode, each memory chip can act as an intermediary node for data transmissions to the signal processing unit.

In a further embodiment, for each of the K sets, the M memory chips of one set and the data link interface of the signal processing unit form a ring network for data transmissions.

In a further embodiment, the data link interface includes K interface transceivers, where a respective one of the K interface transceivers is allocated to a respective one of the K sets, and where for each of the K sets, the M memory chips of the set and the allocated interface transceiver form a ring network for data transmissions.

In a further embodiment, for each of the K sets, the memory chips and the L signal processing engines form a ring network for data transmissions.

In a further embodiment, for each of the K sets, the M memory chips of the set and the L signal processing engines are coupled by a first interconnect and a second interconnect, where the first interconnect is adapted to interface outputs of the memory chips with inputs of the signal processing engines, and where the second interconnect is adapted to interface the inputs of the memory chips with the outputs of the signal processing engines.

In a further embodiment, each of the first and second interconnects includes a single serial Tx/Rx link or is configured to switch over multiple Tx/Rx links.

In a further embodiment, the memory system includes a controller including a first controller to control the first interconnect and second controller to control the second interconnect. Further, the controller can include a memory controller.

In a further embodiment, for each couple of an output of a memory chip and an input of a signal processing engine, the first controller is adapted to adjust a number of lanes connecting the output of the memory chip with the input of the signal processing engine, and where for each couple of an input of a memory chip and an output of a signal processing engine, the second controller is adapted to adjust a number of lanes connecting the input of the memory controller with the output of the signal processing engine.

In a further embodiment, the memory chips are multi-level memory chips having a plurality of programmable levels. For example, the multi-level memory chips are PCM chips or RRAM chips. In particular, the PCM chip includes a plurality of PCM cells. The PCM cell can be understood as a non-linear resistive device. The larger the amorphous size of the PCM cell the stronger is the non-linearity in the current-voltage characteristic.

In a further embodiment, the signal processing unit is embodied as a CODEC unit and the signal processing engine is embodied as a CODEC engine.

In a further embodiment, the K interface transceivers are embodied as K high-speed data link transceivers.

Any embodiment of the first aspect can be combined with any embodiment of the first aspect to obtain another embodiment of the first aspect.

In the following example, the functionality and benefits of the present memory system are illustrated. The exemplary memory system includes N PCM chips, which are organized in K groups with M PCM chips per set, and one CODEC unit with a number of L CODEC or HW engines. The CODECs data interface has K high-speed data-link transceivers (HSDL), while each PCM chip has a single transceiver. Each PCM chip in the group operates either as a source/sink of data or as a pass-through device. In pass-through mode, each PCM chip acts as an intermediate node for transmission of data to and from the CODEC, i.e, the PCM chips of each group form a ring network with the CODEC. The optimum configuration in terms of hardware complexity and achievable data rates depends on the system specifications, such as the PCM chip read access time, the CODEC processing time, the data rate of the HSDL interface, etc. The proposed architecture supports also the two corner configurations: (a) each PCM chip is directly attached to the CODECs data interface (K=N, M=1), (b) all PCM chips form a single group and the CODECs data interface has a single HSDL transceiver (K=1, M=N).

According to an embodiment of the present memory system, sets or groups of PCM chips are interconnected using HSDLs and form a ring with the CODEC unit that contains one or more CODEC engines. The CODEC unit processes a block of read values in order to perform the estimation of the stored information levels. During the write process, the information to be stored in the memory system is translated to codewords by using an encoding function and then the codewords are written to the memory cells. During the read process, a block of codewords is read and then the block is processed by the CODEC. There are multiple system configurations that are supported by the proposed memory architecture: each block of codewords is allocated in a single PCM chip, or each block of codewords is allocated to all PCM chips that form the ring, or a subset of interconnected PCM chips is used for storing each block of codewords.

As mentioned above, the memory system includes N PCM chips which form a ring with the CODEC unit that contains L CODEC engines. Each block of codewords can be stored in one PCM chip and the rate for reading a block is Rb blocks/sec. The size of each block is Lb bits, where Lb account for the codeword size and the resolution in bits used to represent the soft-information in the codeword components. The decoding process in the CODEC unit results to an amount of data that is related with the size of the incoming block and is equal to $\alpha$Lb bits, where $\alpha<1$. The maximum block-decoding rate of each CODEC engine is denoted as Rd and Rc is the HSDL data rate.

For each block of codewords, the HSDL channel is utilized twice, once for transferring the encoded data from the PCM chips to the CODEC and second for transferring back the decoded data to the PCM chips. The following requirements can be satisfied under saturation conditions (continuous read requests): The HSDL should be able to support all transfer requests, Rc$\geq$(1+$\alpha$)LbNRb, where (1+$\alpha$) LbNRb is the total amount of data that has to be transferred through the HSDL ring, and the CODECs should be able to support the overall maximum block rate, NRb$\leq$MRd.

Without loss of generality, it is assumed that, the data overhead introduced by the HSDL transfer protocol is almost negligible compared with the amount of data per decoding cycle. In any case, the overhead introduced can be taken into account by decreasing the value of Rc. The block decoding procedure can either be initiated by the PCM chips or by the CODEC engines. In the first case, when a block of codewords has to be decoded, the PCM chip senses the status of the CODEC engines (if at least one is available) and starts transmitting its data. When decoding has been completed, the CODEC unit waits until the HSDL becomes idle and then transmits the decoded data. The decoded data are stored in temporary digital buffers of the HSDL interface, i.e., set of registers, since there is always free space in the PCM chips that originated the decoding procedure. If a block is distributed into multiple chips, one of these chips is the decoding initiator and all other chips are synchronized to its transfers. In the second case, when a CODEC engine is available, the CODEC unit can initiate a polling procedure to the various PCM chips and retrieves any pending data. The best performance can be achieved when the data owner initiates the data transfer, i.e., the PCM chip at the beginning of the decoding process and the CODEC when the decoded data are available. Accessing the ring can be achieved either using a token or by using a store-and-forward approach. Using a token introduces the minimum latency and in this case all PCM chips, except the transmitting one are in pass-through mode, which means that they act as a simple transceiver and they forward the incoming information with a single bit latency. The above is also valid when each block of codewords is distributed to multiple PCM chips belonging to the same ring of chips. The same holds also for the case where a set of rings shares a set of CODECs.

According to an embodiment of the present invention, a memory arrangement including a plurality of memory systems of the first aspect is provided.

In the following, exemplary embodiments of the present invention are described with reference to the enclosed figures.

Figure 4:
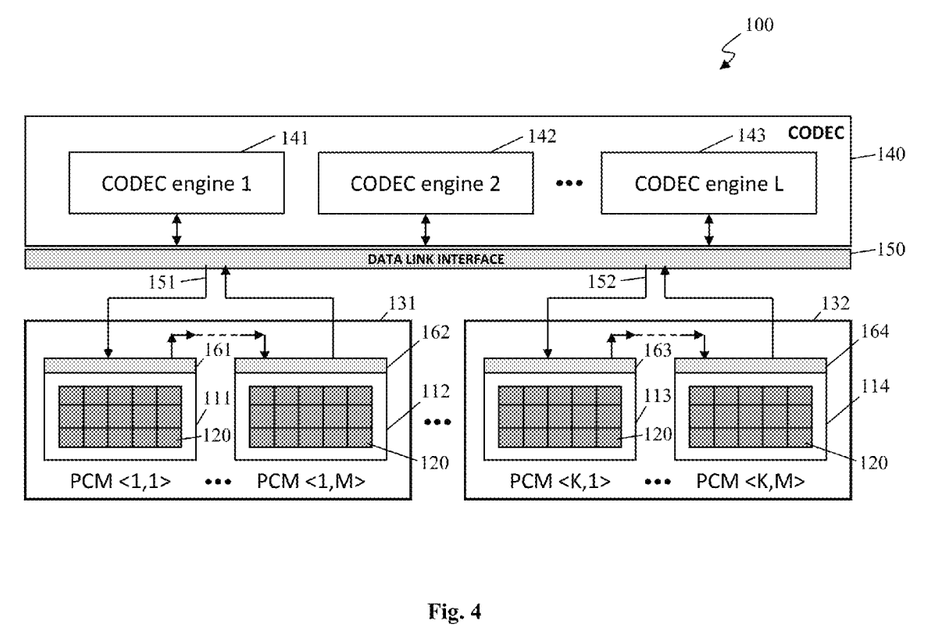
FIG. 4 shows a schematic block diagram of a memory system, according to an embodiment of the present invention.

In FIG. 4, a schematic block diagram of a memory system 100, according to an embodiment of the present invention, is depicted.

Memory system 100 is adapted to store data in a plurality N of memory chips 111-114. Each of memory chips 111-114 includes a number of memory cells 120, in particular memory cells 120 having a plurality of programmable levels. Examples for such multi-level memory chips 111-114 are PCM chips or RRAM chips.

Memory chips 111-114 are grouped into a number K of sets 131-132. Sets 131, 132 can be also called groups.

Furthermore, memory system 100 includes one single signal processing unit 140. Signal processing unit 140 includes a number L of signal processing engines 141-143 for signal processing the data of N memory chips 111-114. Signal processing unit 140 is a CODEC unit, for example. In this example, signal processing engines 141-143 are CODEC engines.

Moreover, signal processing unit 140 has a data link interface 150 for interfacing each of K sets 131, 132.

Data link interface 150 of FIG. 4 includes K interface transceivers. For example, interface transceiver 151 is allocated to set 131, wherein interface transceiver 152 is allocated to set 132. For example, interface transceiver 151 handles the communication between memory chips 111, 112 of set 131 and CODEC unit 140, i.e. CODEC engines 141-143 of CODEC unit 140.

To establish this communication, each of memory chips 111-114 has a single data link chip transceiver 161-164. Each of data link chip transceivers 161-164 is configured to send data to one of the other data link chip transceivers 161-164 or to one of the two interface transceivers 151, 152 and to receive data from one of the other data link chip transceivers 161, 164 or from one of the two interface transceivers 151, 152. Further, data link chip transceivers 161-164 are adapted to pass-through received data to one of the other data link chip transceivers 161-164 or to one of two interface transceivers 151, 152. Thus, data link chip transceivers 161-164 also function as a pass-through device.

Further, for each of the two sets 131, 132 in FIG. 4, M memory chips 111, 112; 113, 114 of one set 131, 132 and data link interface 150 of signal processing unit 140 form a ring network for data transmissions. In the example of FIG. 4, there are two ring networks for data transmissions. A first ring network is formed by M memory chips 111, 112 of set 131 and allocated interface transceiver 151. In an analogous way, a second ring network is formed by M memory chips 113, 114 of set 132 and allocated interface transceiver 152.

Figure 5:
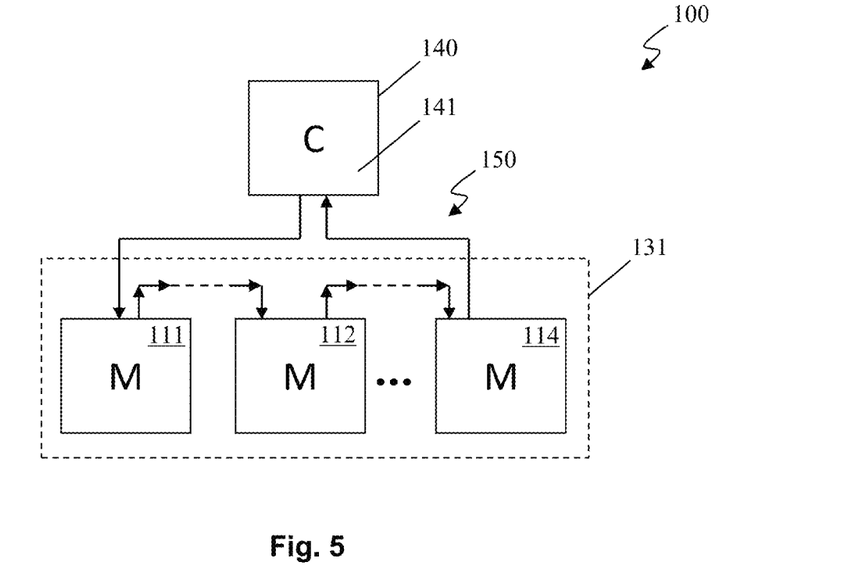
FIG. 5 shows a schematic block diagram of a memory system, according to an embodiment of the present invention.

In FIG. 5, a schematic block diagram of a memory system 100 according to an embodiment of the present invention is depicted. Memory system 100 of FIG. 5 shows a CODEC unit 140 with one CODEC engine 141 and one set 131 including a plurality of memory chips 111-114. The architecture of FIG. 5 is in particular advantageous for a CODEC engine 141 which is faster than memory chips 111-113.

Figure 6:
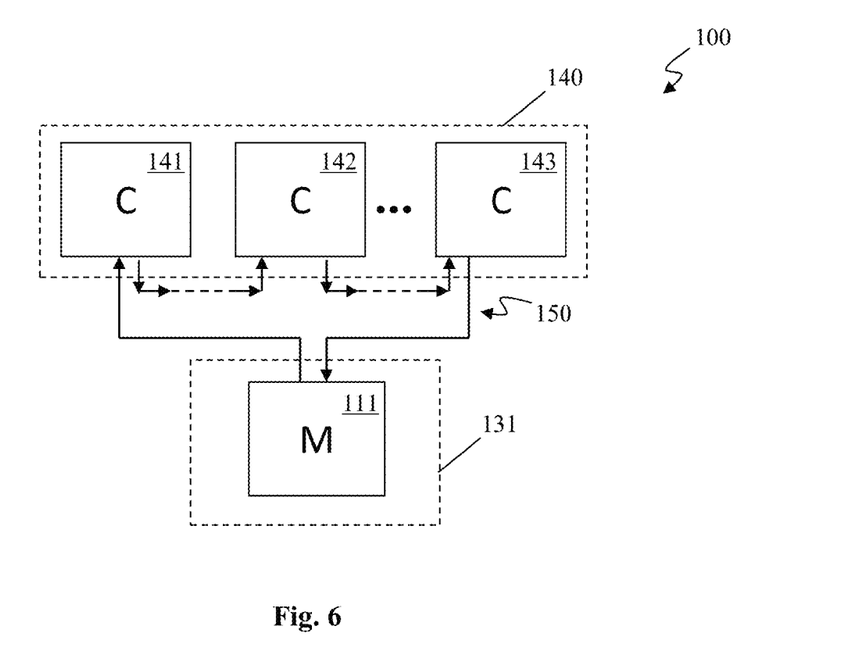
FIG. 6 shows a schematic block diagram of a memory system, according to an embodiment of the present invention.

FIG. 6 shows a schematic block diagram of memory system 100, according to an embodiment of the present invention. CODEC unit 140 of FIG. 6 has a plurality of CODEC engines 141-143, but only one memory chip 111. The architecture of FIG. 6 is very advantageous for a memory chip 111 which is much faster than CODEC engines 141-143.

For both architectures of FIG. 5 and FIG. 6, memory chips 111-114; 111 and signal processing engines 141; 141-143 form a ring network for data transmissions.

Figure 7:
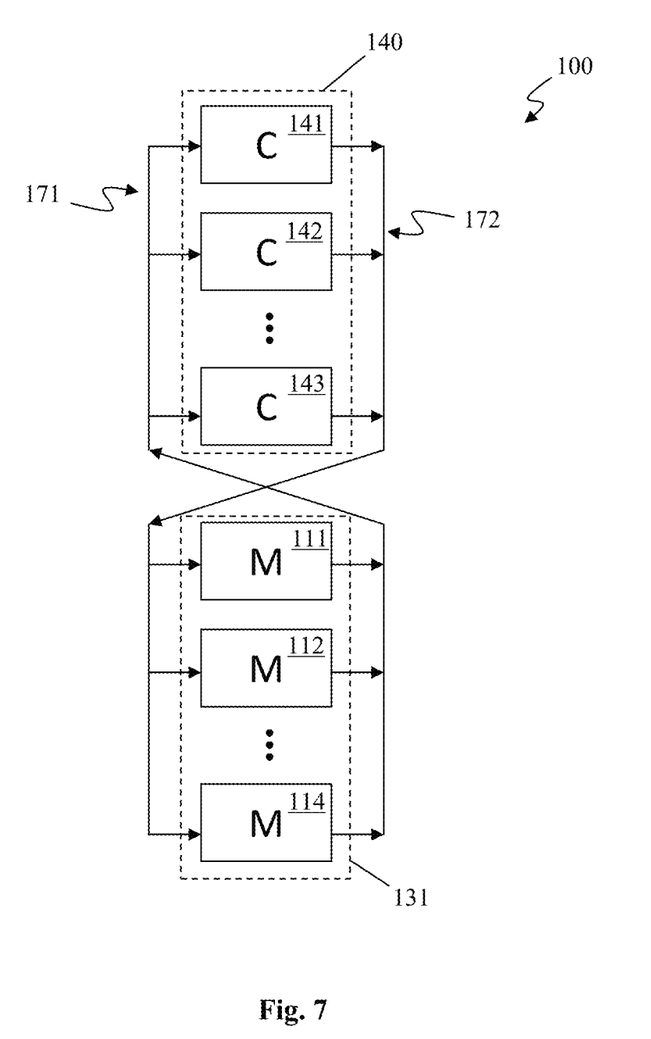
FIG. 7 shows a schematic block diagram of a memory system, according to an embodiment of the present invention.

In FIG. 7, a schematic block diagram memory system 100, according to an embodiment of the present invention, is shown. Memory system 100 of FIG. 7 includes a plurality of CODEC engines 141-143 and a plurality of memory chips 111-113 which are all allocated to one set 131.

Further, memory system 100 of FIG. 7 includes a first interconnect 171 and a second interconnect 172. First interconnect 171 is adapted to interface outputs of memory chips 111-114 with inputs of signal processing engines 141-143. Second interconnect 172 is adapted to interface the inputs of memory chips 111-114 with the outputs of signal processing engines 141-143.

In the example of FIG. 7, interconnects 171, 172 can include a single serial Tx/Rx link, respectively. As an alternative, first and second interconnects 171, 172 can be configured to switch over multiple Tx/Rx links.

Figure 8:
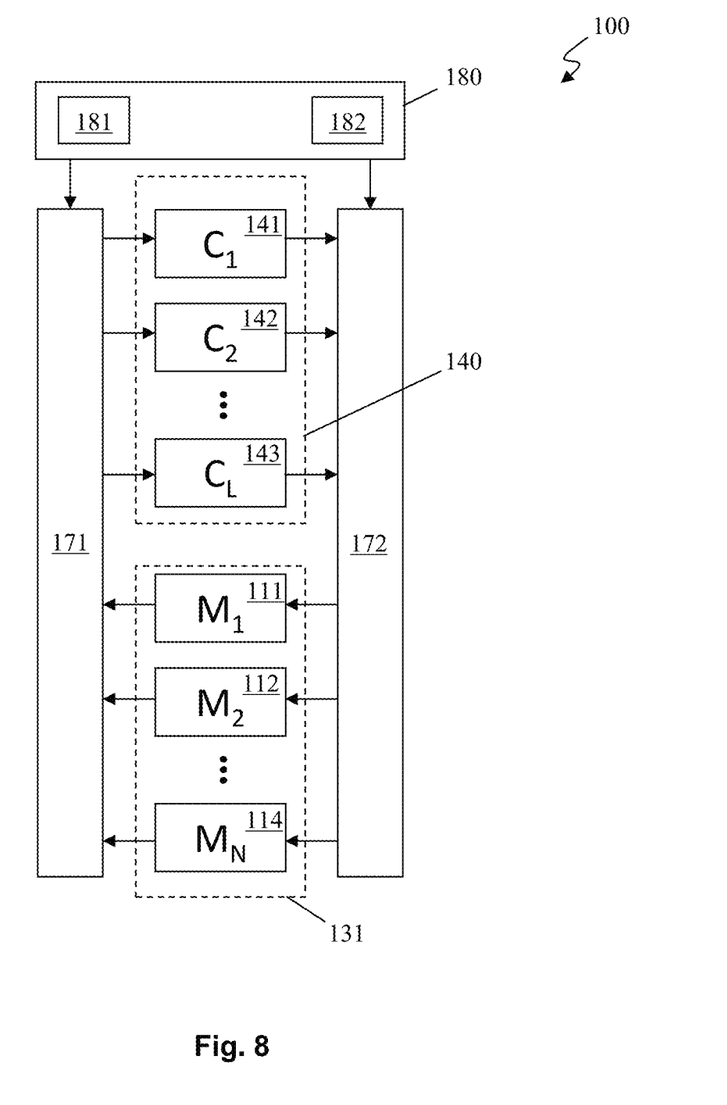
FIG. 8 shows a schematic block diagram of a memory system, according to an embodiment of the present invention.

Further, FIG. 8 shows a schematic block diagram of memory system 100, according to an embodiment of the present invention. Memory system 100 of FIG. 8 includes a plurality of CODEC engines 141-143 and a plurality of memory chips 111-114. Memory chips 111-114 of FIG. 8 are all allocated to one set 131.

Like in FIG. 7, memory system 100 of FIG. 8 includes a first interconnect 171 and a second interconnect 172. In contrast to FIG. 7, first and second interconnects 171, 172 are controllable and adjustable. For controlling interconnects 171, 172, memory system 100 includes a controller 180. Controller 180 includes first controller 181 and second controller 182. First controller 181 is adapted to adjust the number of lanes connecting the outputs of memory chips 111-114 with the inputs of signal processing engines 141-143. Further, second controller 182 is adapted to adjust the number of lanes connecting the inputs of memory chips 111-114 with the outputs of signal link processing engines 141-143. In this regard, a first allocation table M2C allocates outputs of $M_1$-$M_N$ memory chips 111-114 to inputs of the $C_1$-$C_L$ signal processing engines, where M2Cij<=min($M_{Oi}$, $C_{Ij}$) indicates the number of lanes used for transferring data from memory Mi with $M_{Oi}$ outputs to signal processing engine Cj with $C_{Ij}$ inputs for i=1, ..., N and j=1, ..., L. In an analogous way, a second allocation table C2M allocates outputs of the $C_1$-$C_L$ signal processing engines to inputs of the $M_1$-$M_N$ memory chips 111-114, where C2Mji<=min($C_{Oj}$,$M_{Ii}$) indicates the number of lanes used for transferring data from signal processing engine Cj with $C_{Oj}$ outputs to memory Mi with $M_{Ii}$ inputs. The index L in $C_L$ shows that memory system 100 includes L signal processing engines 141-143, wherein the index N in $M_N$ indicates that memory system 100 includes N memory chips 111-114.

Figure 9:
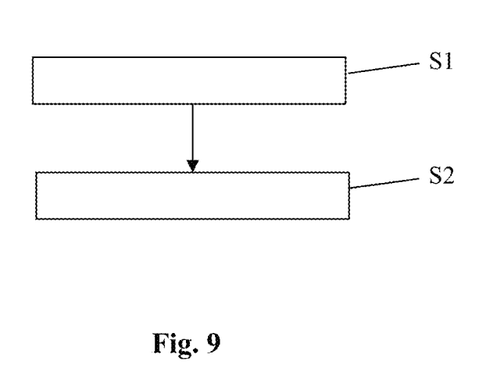
FIG. 9 shows a sequence of method steps for operating a memory system, according to an embodiment of the present invention.

FIG. 9 shows an embodiment of a sequence of method steps for operating a memory system 100. Examples of memory system 100 are given in FIGS. 4-10. Memory system 100 is configured to store data in a plurality N of memory chips 111-114 and includes one signal processing unit 114 including a number L of signal processing engines 141-143 for signal processing the data of N memory chips 111-114.

In a first step, the N memory chips are grouped into a number K of sets of memory chips, with N=K·M. In a second step, each of the K sets is interfaced with the signal processing unit by means of a data link interface.

In step S1, N memory chips 111-114 are grouped into a number K of sets 131-132 of memory chips 111-114, with N=K·M.

In step S2, each of K sets 131, 132 is interfaced with signal processing unit 140 by means of a data link interface 150.

According to an embodiment of the present invention, a computer program including a program code for executing at least one step of the method for operating a memory system when run on at least one computer is provided.

According to an embodiment of the present invention, a memory device is provided. The memory device includes a memory system of the first aspect, and a read/write apparatus for reading and writing data in the memory chips of the memory system.

As will be appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects. Furthermore, aspects of the present invention can take the form of a computer program product embodied in one or more computer readable medium(s) having computer readable program code embodied thereon. Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium can include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electromagnetic, optical, or any suitable combination thereof. A computer readable signal medium can be any computer readable medium that is not a computer readable storage medium and that can communicate, propagate, or transport a program for use by or in connection with an instruction execution system, apparatus, or device. Program code embodied on a computer readable medium can be transmitted using any appropriate medium, including but not limited to wireless, wireline, optical fiber cable, RF, etc., or any suitable combination of the foregoing.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on unit 801, partly thereon, partly on a unit 801 and another unit 801, similar or not.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by one or more computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved and algorithm optimization. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

More generally, while the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiments disclosed, but that the present invention will include all embodiments falling within the scope of the appended claims.

What is claimed is:

1. A memory system for storing data in a plurality N of memory chips, the memory system comprising:
   a number K of sets of memory chips, wherein each set of the K sets includes a number M of the memory chips, with N=K·M, the M memory chips including M data link chip transceivers, wherein each of the M memory chips includes a single one of the M data link chip transceivers, and wherein the N memory chips are grouped into the K sets of memory chips according to a first process; and
   one signal processing unit having a number L of signal processing engines for signal processing data of the N memory chips and having a data link interface for interfacing each of the K sets, the data link interface including an interface transceiver that is assigned to couple any one of the grouped K sets of memory chips to any one of the L signal processing engines within the one signal processing unit based on one or more of the M memory chips within the grouped set sensing the availability status of one of the L processing engines according to a second process that follows the first process, the interface transceiver transmitting data to a first one of the data link chip transceivers and receiving data from a second one of the data link chip transceivers, and the first one of the data link chip transceivers transmitting data to the second one of the data link chip transceivers,
   wherein the interface transceiver, the first one of the data link chip transceivers, and the second one of the data link chip transceivers form a reconfigurable ring network with the one of the L processing engines determined to be available according to the second process,
   wherein N is an integer value greater than or equal to 4, K is an integer value greater than or equal to 2, L is an integer value greater than or equal to 2, and M is an integer value greater than or equal to 2 and less than N.

2. The memory system according to claim 1, wherein the data link interface includes K interface transceivers, and a respective one of the K interface transceivers is allocated to a respective one of the K sets.

3. The memory system according to claim 1, wherein each of the N data link chip transceivers is configured to send data to one of a N-1 other data link chip transceivers or to one of the K interface transceivers, to receive data from one of the N-1 other data link chip transceivers or from one of the K interface transceivers, and to pass through received data to one of the N-1 other data link chip transceivers or to one of the K interface transceivers.

4. The memory system according to claim 1, wherein the data link interface includes K interface transceivers, wherein a respective one of the K interface transceivers is allocated to a respective one of the K sets, and wherein for each of the K sets, the M memory chips of the set and the allocated interface transceiver form a ring network for data transmissions.

5. The memory system according to claim 1, wherein for each of the K sets, the memory chips and the L signal processing engines form a ring network for data transmissions.

6. The memory system according to claim 4, wherein the K interface transceivers are embodied as K high-speed data link transceivers.

7. A method of operating a memory system for storing data in a plurality N of memory chips, wherein the memory system includes the N memory chips and one signal processing unit having a number L of signal processing engines for signal processing the data of the N memory chips, the method comprising:
   grouping the N memory chips into a number K of sets of M memory chips, with N=K·M, the M memory chips including M data link chip transceivers, wherein each of the M memory chips includes a single one of the M data link chip transceivers, and wherein the N memory chips are grouped into the K sets of memory chips according to a first process; and
   interfacing each of the K sets with the signal processing unit by means of a data link interface, the data link interface including an interface transceiver that is assigned to couple any one of the grouped K sets of memory chips to any one of the L signal processing engines within the one signal processing unit based on one or more of the M memory chips within the grouped set sensing the availability status of one of the L processing engines according to a second process that follows the first process, the interface transceiver transmitting data to a first one of the data link chip transceivers and receiving data from a second one of the data link chip transceivers, and the first one of the data link chip transceivers transmitting data to the second one of the data link chip transceivers,
   wherein the interface transceiver, the first one of the data link chip transceivers, and the second one of the data link chip transceivers form a reconfigurable ring network with the one of the L processing engines determined to be available according to the second process and
   wherein N is an integer value greater than or equal to 4, K is an integer value greater than or equal to 2, L is an integer value greater than or equal to 2, and M is an integer value greater than or equal to 2 and less than N.

* * * * *